(12) United States Patent
Hartswick et al.

(10) Patent No.: US 6,251,773 B1
(45) Date of Patent: Jun. 26, 2001

(54) METHOD OF DESIGNING AND STRUCTURE FOR VISUAL AND ELECTRICAL TEST OF SEMICONDUCTOR DEVICES

(75) Inventors: Thomas J. Hartswick, Underhill; Mark E. Masters, Essex Junction, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/473,635

(22) Filed: Dec. 28, 1999

(51) Int. Cl.[7] .............................................. H01L 21/4763
(52) U.S. Cl. ........................ 438/631; 438/17; 438/598; 438/599; 438/633; 438/692; 438/926
(58) Field of Search ................................. 438/14, 17, 598, 438/599, 631, 633, 692, 926, 947

(56) References Cited

U.S. PATENT DOCUMENTS

| 4,587,549 | 5/1986 | Ushiku | 357/71 |
|---|---|---|---|
| 4,670,091 | 6/1987 | Thomas et al. | 156/643 |
| 4,916,514 | 4/1990 | Nowak | 357/68 |
| 5,032,890 | 7/1991 | Ushiku et al. | 357/41 |
| 5,278,105 | 1/1994 | Eden et al. | 437/250 |
| 5,441,915 * | 8/1995 | Lee | 438/631 |
| 5,459,093 * | 10/1995 | Kuroda et al. | 438/599 |
| 5,598,010 | 1/1997 | Uematsu | 257/48 |
| 5,733,798 | 3/1998 | Michael et al. | 437/195 |
| 5,798,298 | 8/1998 | Yang et al. | 438/622 |
| 5,811,352 * | 9/1998 | Numata et al. | 438/622 |
| 5,854,125 | 12/1998 | Harvey | 438/626 |
| 5,899,706 | 5/1999 | Kluwe et al. | 438/129 |

* cited by examiner

*Primary Examiner*—Matthew Smith
*Assistant Examiner*—Craig P. Lytle
(74) *Attorney, Agent, or Firm*—Robert A. Walsh

(57) ABSTRACT

In a semiconductor device using fill shape patterns incorporated into wiring levels to increase the planarity of the wiring levels, the fill shapes are aligned from one wiring level to another wiring level to provide lines of sight to lower wiring levels for visual inspection. Also, in accordance with the invention, selected aligned fill shapes are interconnected with vias to form conductive stacks for contacting lower wiring level conductive wires from upper wiring levels in order to perform electrical test probing/diagnostics.

16 Claims, 12 Drawing Sheets

METHOD OF DESIGNING AND STRUCTURE FOR VISUAL AND ELECTRICAL TEST OF SEMICONDUCTOR DEVICES

FIELD OF THE INVENTION

The present invention relates to the field of semiconductor device testing; more specifically, it relates to a structure for visual and electrical test (probing/diagnostics) of semiconductor devices using fill shape patterns incorporated into wiring levels and methods for forming these structures.

BACKGROUND OF THE INVENTION

Advanced semiconductor devices increasingly require more complex wiring schemes to wire together individual elements into circuits. These schemes rely on multilevel structures formed from wiring levels containing conductive wires and interconnect levels containing conductive vias that connect conductive wires on two different wiring levels together.

Fabrication of such multilevel structures often requires the use of a fabrication technique called chemical-mechanical-polishing (CMP) of the wiring levels and the interconnect levels. However CMP can cause variations in the flatness of the top surface of semiconductor devices severe enough to effect the quality of the photolithographic process steps used to define the patterns of wires and vias in the wiring and interconnect levels. Variations in flatness occur most frequently on the wiring levels and are caused by differences in conductive wire densities from region to region on the surface semiconductor level being then fabricated. This creates differences in polish rate so more or less material is removed from one region than another. In an attempt to solve this problem, methods have been developed that distribute fill shapes, formed at the same time and of the same material as the conductive wires, in such a manner as to attempt to keep the density of conductive material and therefore the polishing rate, the same in all regions. Fill shapes are isolated from the conductive wires and do not carry electrical signals or power. Fill shapes are added to the design data during the design process.

FIG. 1 is a cross-sectional partial view through the wiring and interconnect levels of a semiconductor die illustrating the placement of fill shapes as presently practiced. Semiconductor device 1 is comprised of substrate 10 and via levels 20, 40, 60, 80, 100, and 120 alternating with wiring levels 30, 50, 70, 90, 110, and 130. Passivation level 140 seals the device. Wiring levels 50, 70, 90, 110, and 130, in addition to having conductive wires also have fill shapes. Fill shapes are designated by the letter "F" in order to more easily distinguish them for the reader. Fill shapes are conductive as well. Conductive level 50 has conductive wire 50A and fill shapes 52A through 52H. Conductive level 70 has conductive wires 70A through 70C and fill shapes 72A and 72B. Conductive level 90 has conductive wire 90A and 90B and fill shapes 92A through 92F. Conductive level 110 has conductive wire 110A and 110B and fill shapes 112A through 112C. Conductive level 130 has conductive wires 130A and 130B and fill shapes 132A through 132D. Via level 20 has vias 20A through 20C connecting conductive wire 30A with substrate 10 and vias 20D and 20E connecting conductive wire 30B with substrate 10. Via level 40 has via 40A connecting conductive wire 30B with conductive wire 50A. Via level 60 has via 60 A connecting conductive wire 50A with conductive wire 70C. Via level 80 has via 80A connecting conductive wire 70A with conductive wire 90A. Via level 100 has via 100A connecting conductive wire 90A with conductive wire 110A and via 100B connecting conductive wire 90B with conductive wire 110B. Via level 120 has via 120A connecting conductive wire 110A with conductive wire 130A and via 120B connecting conductive wire 110B with conductive wire 130B. All the conductive wires, vias, and fill shapes are held in a matrix of insulator 15 which may be the same insulating material or a different insulating material level to level.

In general insulators are optically transparent or semi-transparent while conductors are not in the thickness' used in semiconductor devices. As may be readily seen from FIG. 1, the placement of fill shapes of each of the wiring levels has been done independent of any other level so that when doing a visual inspection fill shapes on higher levels can block line of sight views to the lower wiring and interconnect levels of the device, limiting the usefulness of visual inspection for cause of fail or reliability assessment. For example, in FIG. 1, only conductive wires 130A, 130B and 110A are directly visible, fill shapes 112A, 112B, 112C, and 92F blocking the line of sight from the top surface.

Additionally, should electrical probing of lower levels be desired, the fill shapes block direct access to the lower levels either forcing removal of higher levels and subsequent loss of some or all of the device functionality or the milling of an access hole through the dielectric 15 and fill shapes in the path with the problematic differing etch/mill rates associated with the differing materials. For example, in, FIG. 1, if it was desired to contact conductive wire 70C, levels 140, 130, 120, 110, 110, 90, and 80 would need to be removed.

SUMMARY OF THE INVENTION

It is an object of the present invention to provide a method for vertically aligning fill shapes in several wiring levels in order to provide for line of sight views to lower wiring levels of the device.

This object of the invention is accomplished in a first method, by placing fill shapes on different wiring levels relative to a universal virtual grid. In a second method, fill shape placement is first performed on the highest wiring level requiring fill, and each lower wiring level is successively filled by aligning its fill shapes to those in the next higher wiring level.

It is a another object of the present invention to provide a method of making electrical taps to lower level conductive wires so they may be accessible from the top or near the top level of the device without having to delayer the device or at least minimize the amount of delayering.

This object of the invention is accomplished by connecting selected aligned fill shapes in several wiring levels with vias over the conductive wire to be tapped thus forming a conductive vertical stack. This stack is connected to the conductive wire by a via as well. In a first method, adjacent locations along a conductive wire are examined in sequence to see if aligned fill shapes exist in all higher levels above that location and as soon as one is found, the vias added. A second method is similar to the first, but differs in that aligned fill shapes are required as a prerequisite. In a third method, linking wires are used to connect selected conductive wires to the vertical conductive stack.

BRIEF DESCRIPTION OF DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Network circuit (net) wiring is formed from wire segments which are pieces of conductive wires connected to other conductive wires on other levels by vias. There may be several wire segments of the same net on the same wiring level and there may be portions of the same net on several different wiring levels. Conductive wires are formed in wiring levels, and vias in interconnect levels. Fill shapes are formed in the wiring levels. The methods described below intended to be applied to the design shapes data of the semiconductor device which is used to fabricate the device mask set. Net information is contained in the shapes design data.

Figure 1:
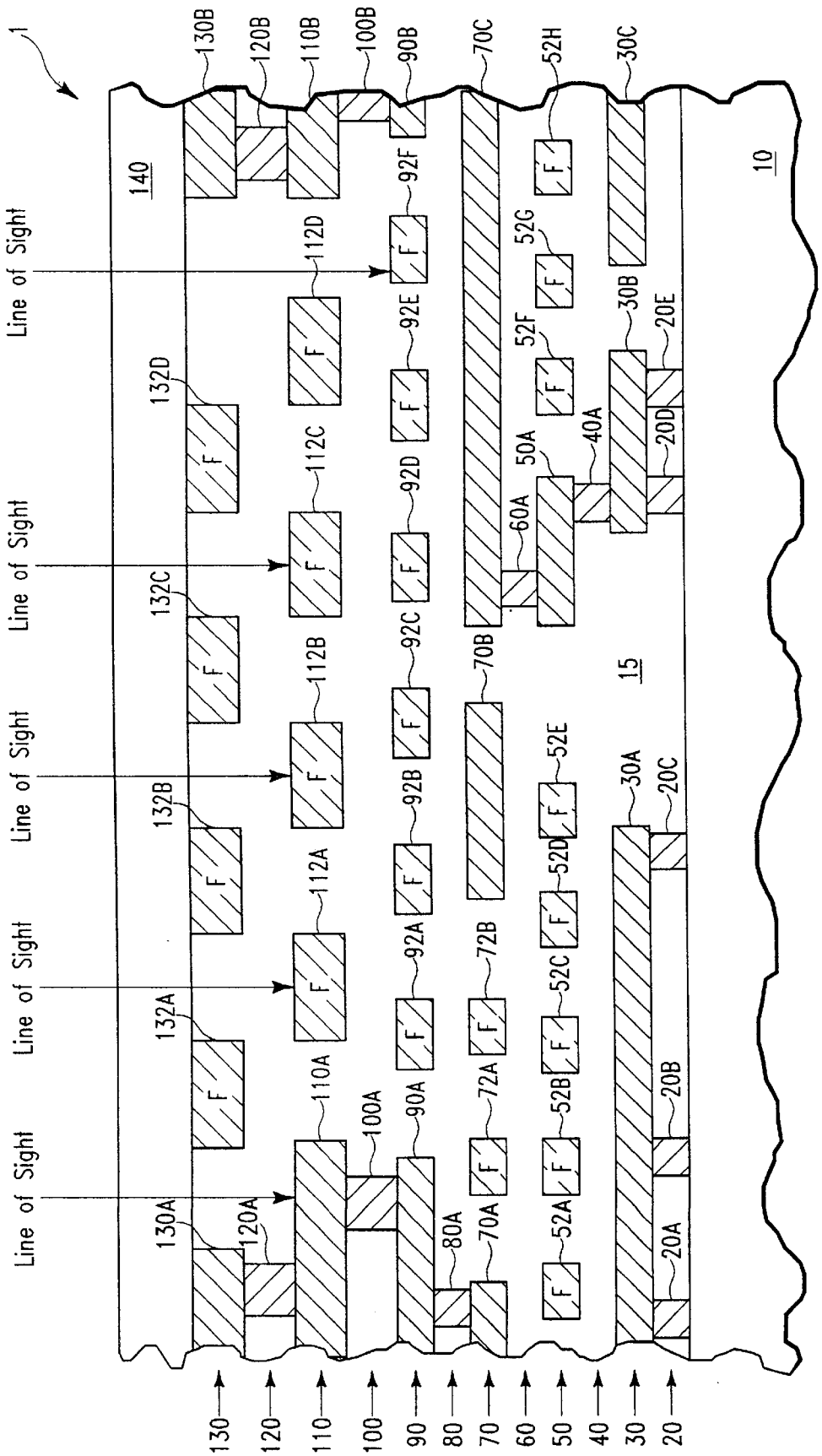
FIG. 1 is a cross-sectional partial view through the wiring and interconnect levels of a semiconductor die illustrating the placement of fill shapes as presently practiced.
Figure 2:
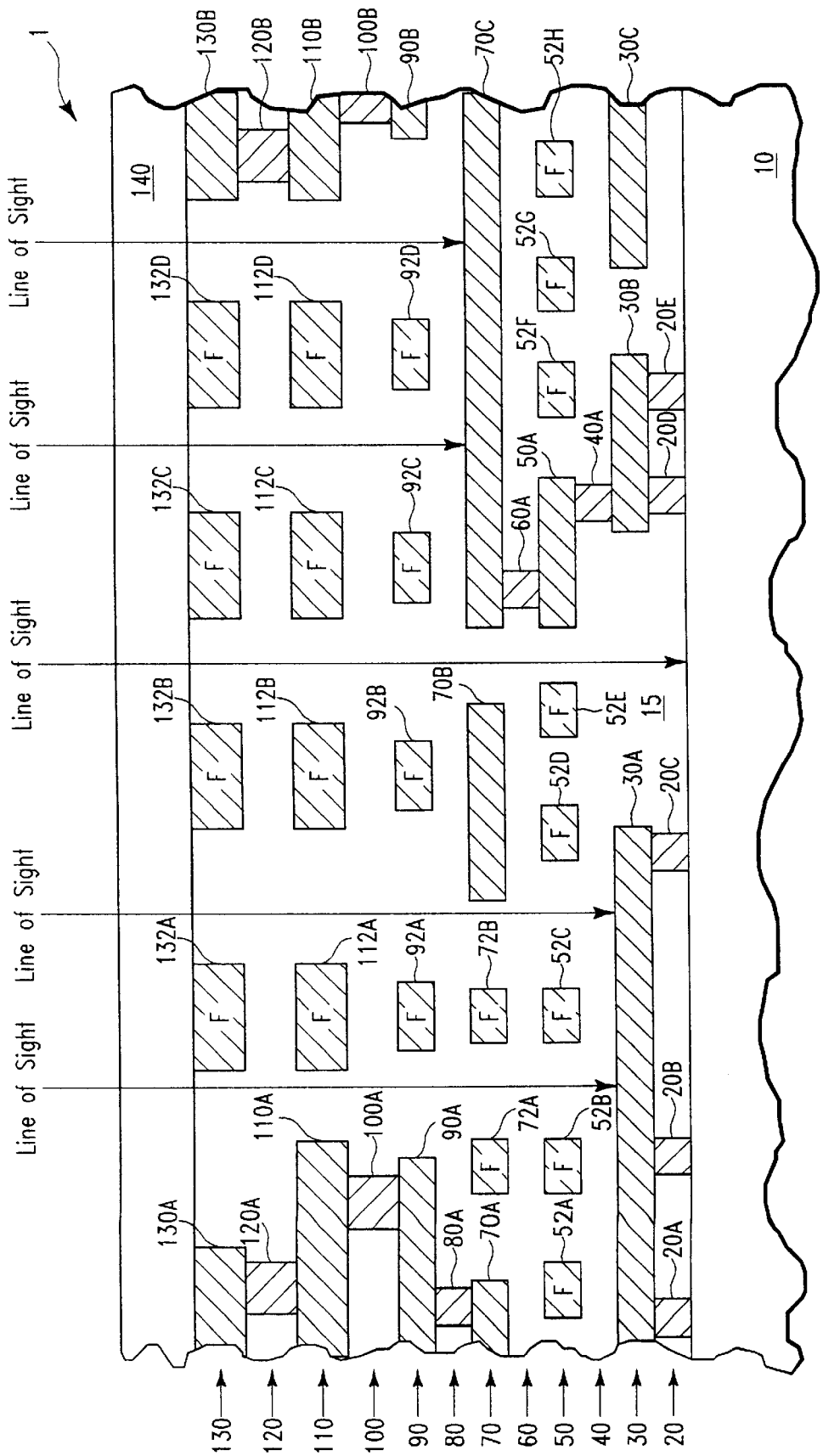
FIG. 2 is a cross-sectional partial view through the wiring and interconnect levels of a semiconductor die illustrating the placement of fill shapes according to the present invention.

FIG. 2 is a cross-sectional partial view through the wiring and interconnect levels of a semiconductor die illustrating the placement of fill shapes according to the present invention. FIG. 2 may be profitably compared to FIG. 1. It can be seen that from the highest wiring level to the lowest wiring level certain fill shapes have been vertically aligned to one another. For example fill shapes 52C, 72B, 92A, 112A, and 132A in wiring levels 50, 70, 90, 110, and 130 have been vertically aligned to provide line of sight view to conductive wire 30A in wiring level 30. Some other alignments present in FIG. 2 include 92B, 112B, and 132B; 92C, 112C, and 132C; and 92D, 112D and 132D provide other lines of sight. It can also be seen in FIG. 2 that neither fill shapes 52D or 52E are aligned to fill shape 92B or fill shape 52F or 52G are aligned to fill shape 92D. This occurs when changing the size or spacing of fill shapes would violate density rules that the CMP process requires.

Figure 3:
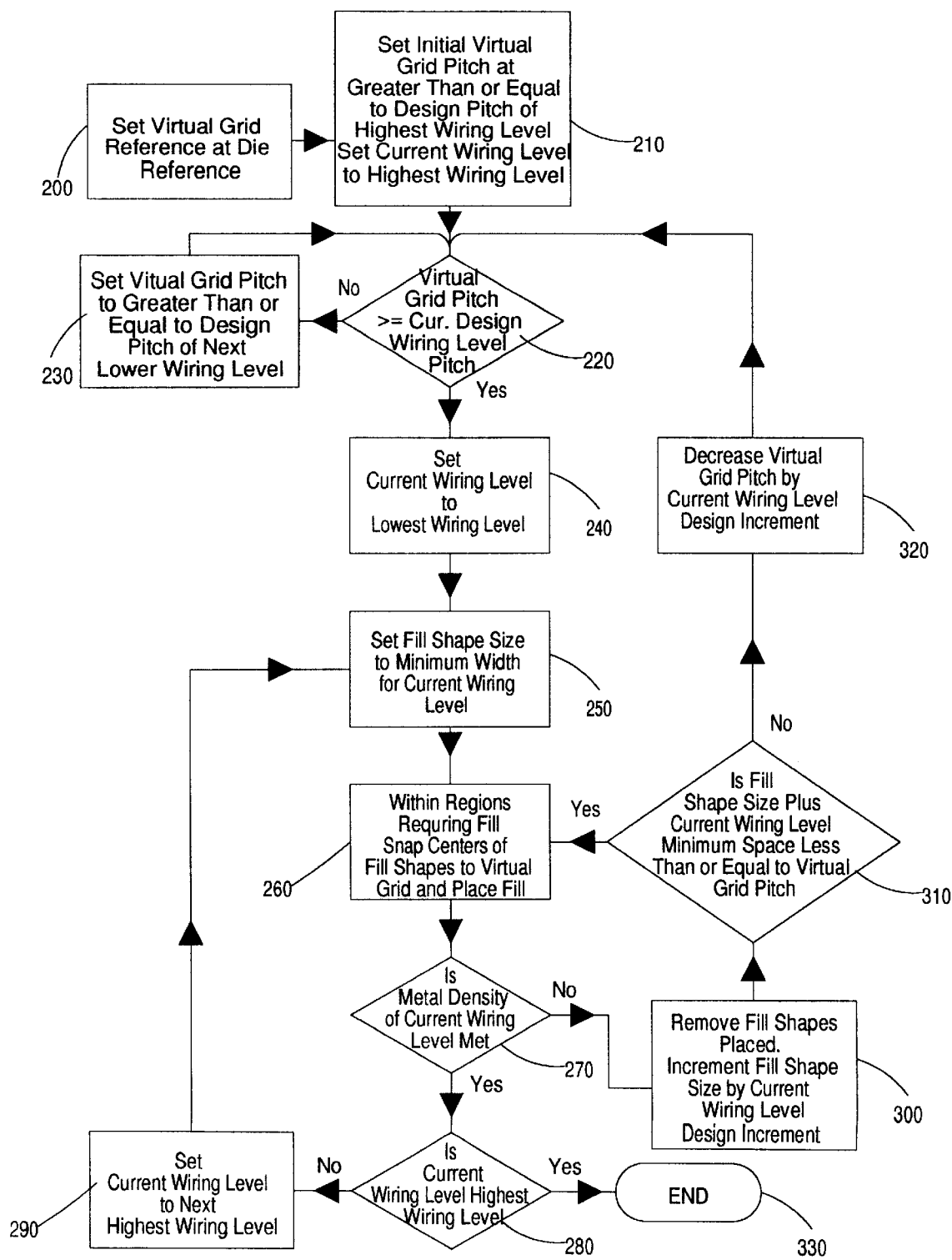
FIG. 3 is a flowchart illustrating a first method of placing fill shapes according to the present invention.

A first method of placing fill shapes is illustrated in FIG. 3 and described below. FIG. 3 is a flowchart illustrating a first method of placing fill shapes according to the present invention. In this embodiment, fill shapes are added to the wiring levels from lowest to highest. In step 200 a virtual grid reference point is set to the same reference as the semiconductor device die design reference. Next, in step 210, an initial virtual grid pitch is set that is greater than or equal to the minimum design pitch of the highest wiring level. Preferably, one would initially set this pitch high to reduce the number of fill shapes. Then, in step 220 a test is performed to see if the virtual grid pitch is still greater than the current wiring level design pitch. This is necessary because subsequent steps may change this relationship. If the virtual pitch is not greater or equal to the current wiring level pitch, the virtual grid pitch is set to greater than or equal to the minimum design pitch of the next lower wiring level in step 230 and the process loops back to the test in step 220. If the virtual pitch is greater or equal to the current wiring level pitch, the current wiring level is set to the lowest wiring level in step 240. Next, in step 250 the fill shape size is set to the minimum width for the current wiring level. Then, in step 260 fill shapes are added to the design by snapping the centers of the fill shapes to the virtual grid. Next, in step 270 a test is performed to see if the metal density requirements for the current wiring level have been met. These are rules based on the CMP process used for fabricating the current wiring level. If the process requirements are met, a second test is performed to see if the current wiring level is the highest wiring level, if it is the process terminates in step 330 and the dataset with fill shapes added is complete. If the current wiring level is not the highest wiring level then the current wiring level is set to the next highest wiring step in step 290 and the process loops back to step 250.

Returning to the test of step 270, if the metal density of the current level is too low (not met), all fill shapes placed on the current wiring level are removed, and the fill shape size increased by the current wiring level design increment in step 330. The design increment is the smallest value by which a dimension may be incremented. Then a test in step 310 is performed to determine if the new fill shape size plus the current wiring level minimum space is less than or equal to the virtual grid pitch. If it is, the process loops back to step 260. If it is not, then the virtual pitch is decreased by the current wiring level design increment in step 320, and the process loops back to the test in step 220.

Figure 4:
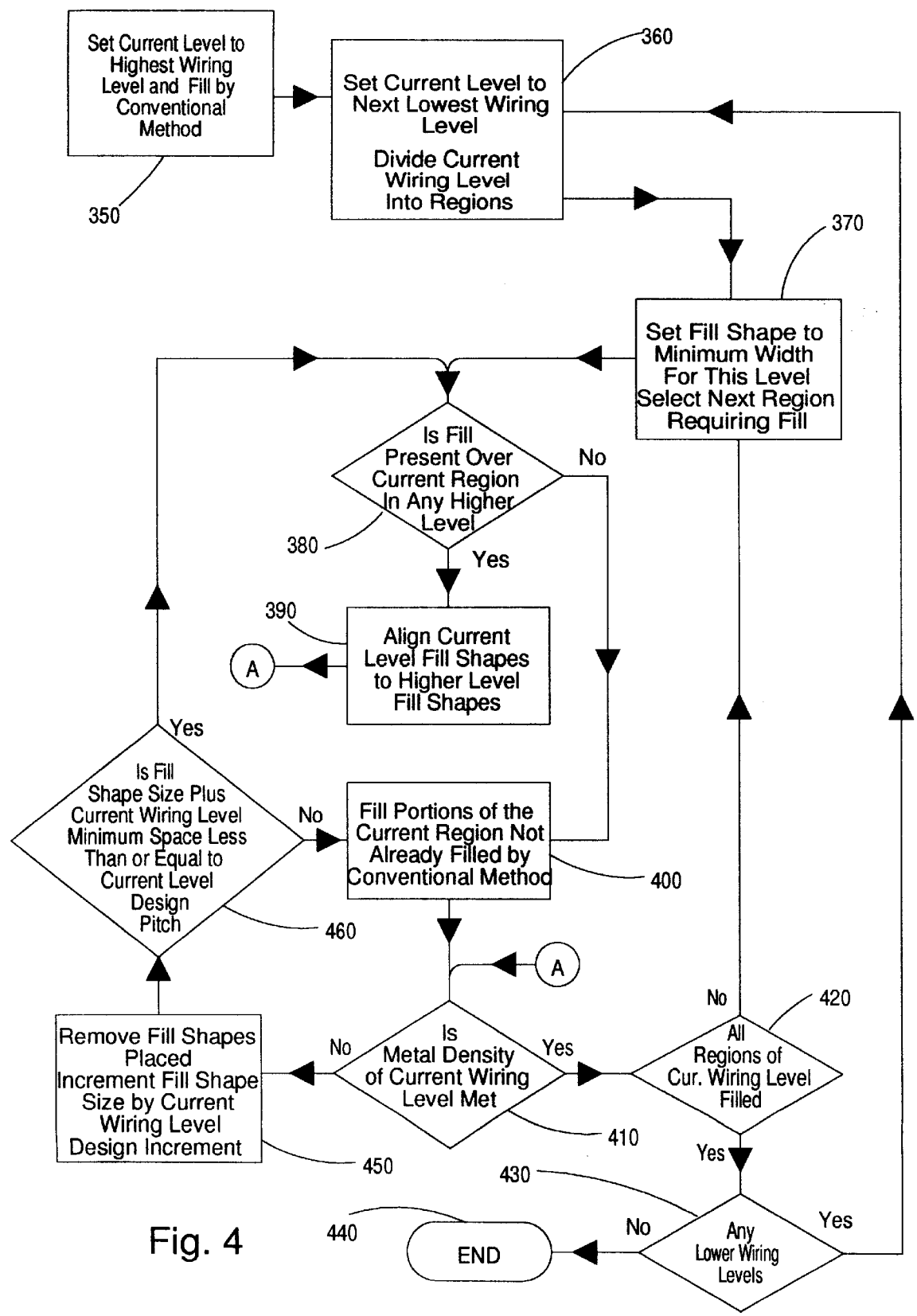
FIG. 4 is a flowchart illustrating a second method of placing fill shapes according to the present invention.

A second method of alignment of fill shapes is illustrated in FIG. 4 and described below. FIG. 4 is a flowchart illustrating a second method of placing fill shapes according to the present invention. In this embodiment fill shapes are added to the wiring levels from highest to lowest and no virtual grid is used. In the first step, step 350, the current wiring level is set to the highest wiring level requiring the addition of fill shapes, and this level is filled using conventional fill methods. The location of fill shapes is independent of line of sight considerations. Next, in step 360, the current wiring level is set to the next lowest wiring level, the fill shape size is set to the minimum width for the current level, and the current level divided into regions requiring fill. Regions may be determined by differing fill requirements, differing needs for line of sight views, for reduction in data process time, the existence of overlying fill shapes, or other reasons. Next in step 370 the next region requiring fill is selected and in step 380 a test performed to determine if fill shapes are present over the current region in any of the higher wiring levels. In step 380 a test performed to determine if fill shapes are present over the current region in any of the higher wiring levels. If there are overlying fill shapes then current level fill shapes are added and aligned to the overlying fill shapes in step 390 and the density test of step 410 performed. If there are no overlaying fill shapes then fill shapes are added to the current region conventionally, without regard to alignment of fill shapes, in step 400 and density test of step 410 performed. In step 410 a test is performed to see if the metal density requirements for the current wiring level have been met as was done in the first method above. If the result of the test is metal density met, then the test of step 420 is performed which is a check to see if all regions of the current wiring level have been filled. If not, then the process loops back to step 370. If all regions have been filled then the test of step 430 is performed to see if any lower wiring levels remain to be filled. If yes, then the process loops to step 360, if no wiring levels are left to be filled, the process terminates in step 440 and the dataset with fill shapes added is complete.

Returning to the density test of step 410, if the metal density of the current level is not met, metal density is too low, then all the fill shapes added to the current region of the current level are removed, and the fill shape size incremented by the current wiring level design increment in step 450. Next the test of step 460 is performed. If the current fill shape size when added to the current wiring level minimum space is less than or equal to the current design level pitch then the process loops to step 380, otherwise the process loops to step 400.

Figure 5:
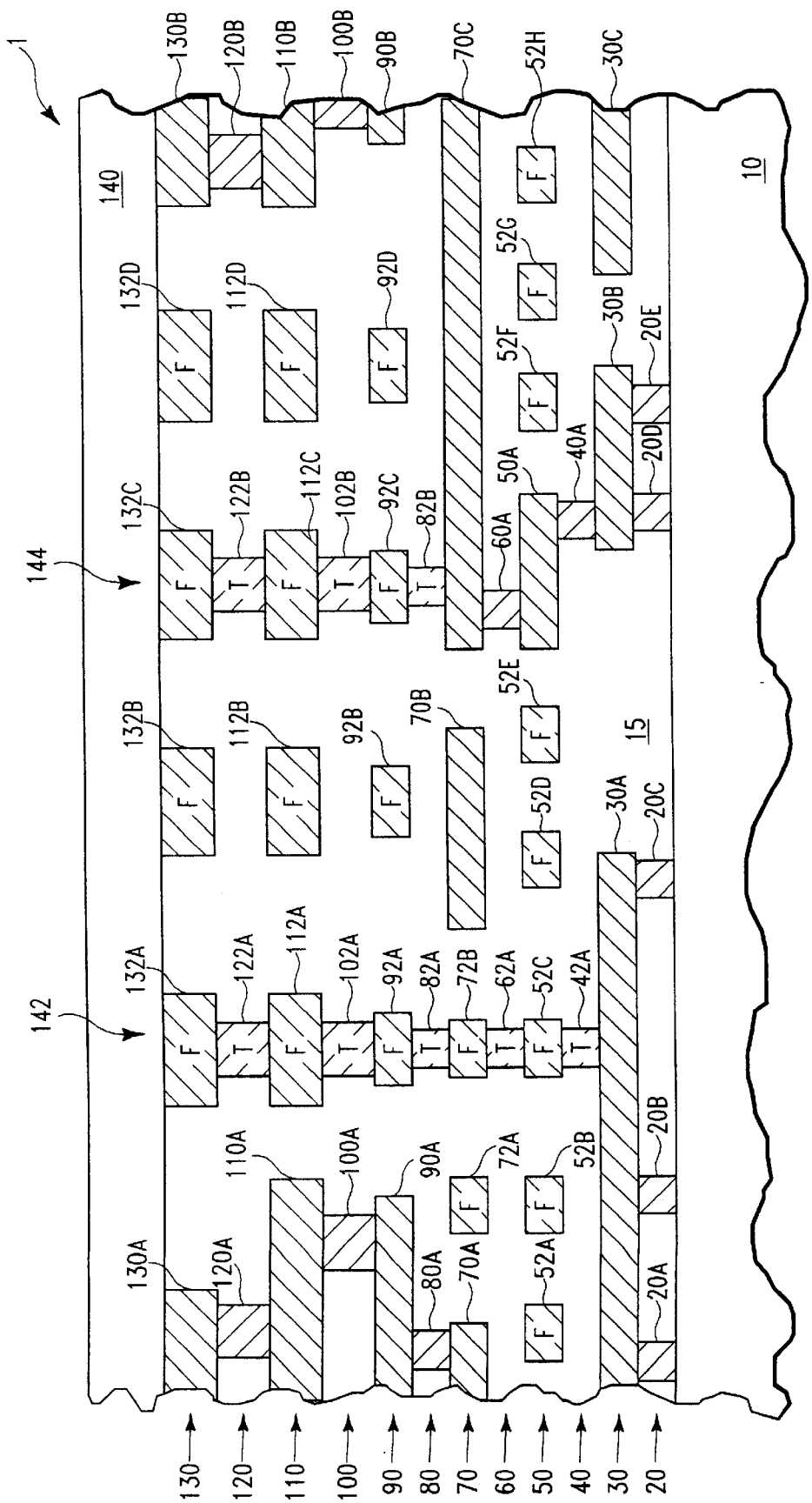
FIG. 5 is a cross-sectional partial view through the wiring and interconnect levels of a semiconductor die illustrating the placement of fill shapes and interconnection of the fill shapes to each other and to certain conductive wires by conductive vias.

Turning now to FIG. 5, which is a cross-sectional partial view through the wiring and interconnect levels of a semiconductor die illustrating the placement of fill shapes and interconnection of the fill shapes to each other and to certain conductive wires by conductive vias. Thus vertically conductive stacks are provided according to another aspect of the present invention. FIG. 5 may be profitably compared to FIG. 2. It can be seen that from the highest wiring level to the lowest wiring level certain fill shapes have been vertically aligned to one another. For example fill shapes 52C, 72B, 92A, 112A, and 132A in wiring levels 50, 70, 90, 110, and 130 have been vertically aligned. Fill shapes are designated by the letter "F" in order to more easily distinguish them for the reader. Some other alignments present in FIG. 5 include 92B, 112B, and 132B; 92C, 112C, and 132C; and 92D, 112D and 132D. Connecting wire 30A to fill shape 52C is a tapping via 42A. Connecting fill shape 52C to fill shape 72B is tapping via 62A. Connecting fill shape 72B to fill shape 92A is tapping via 82A. Connecting fill shape 92A to fill shape 112A is tapping via 102A. Connecting fill shape 112A to fill shape 132A is tapping via 122A. The tapping vias are designated by the letter "T" in order to more easily distinguish them for the reader. This series of interconnected aligned fill shapes constitutes vertical conductive stack 142 which may be used to electrically tap wire 30A without delayering device 1. Wire 30A may be thought of as a wire segment of a net. Also show in FIG. 5 is vertical conductive stack 144 formed from tapping via 82B, fill shape 92C, tapping via 102B, fill shape 112C, tapping via 122B, and fill shape 132C. This stack allows tapping of conductive wire 70C which may also be thought of as a wire segment.

Figure 6:
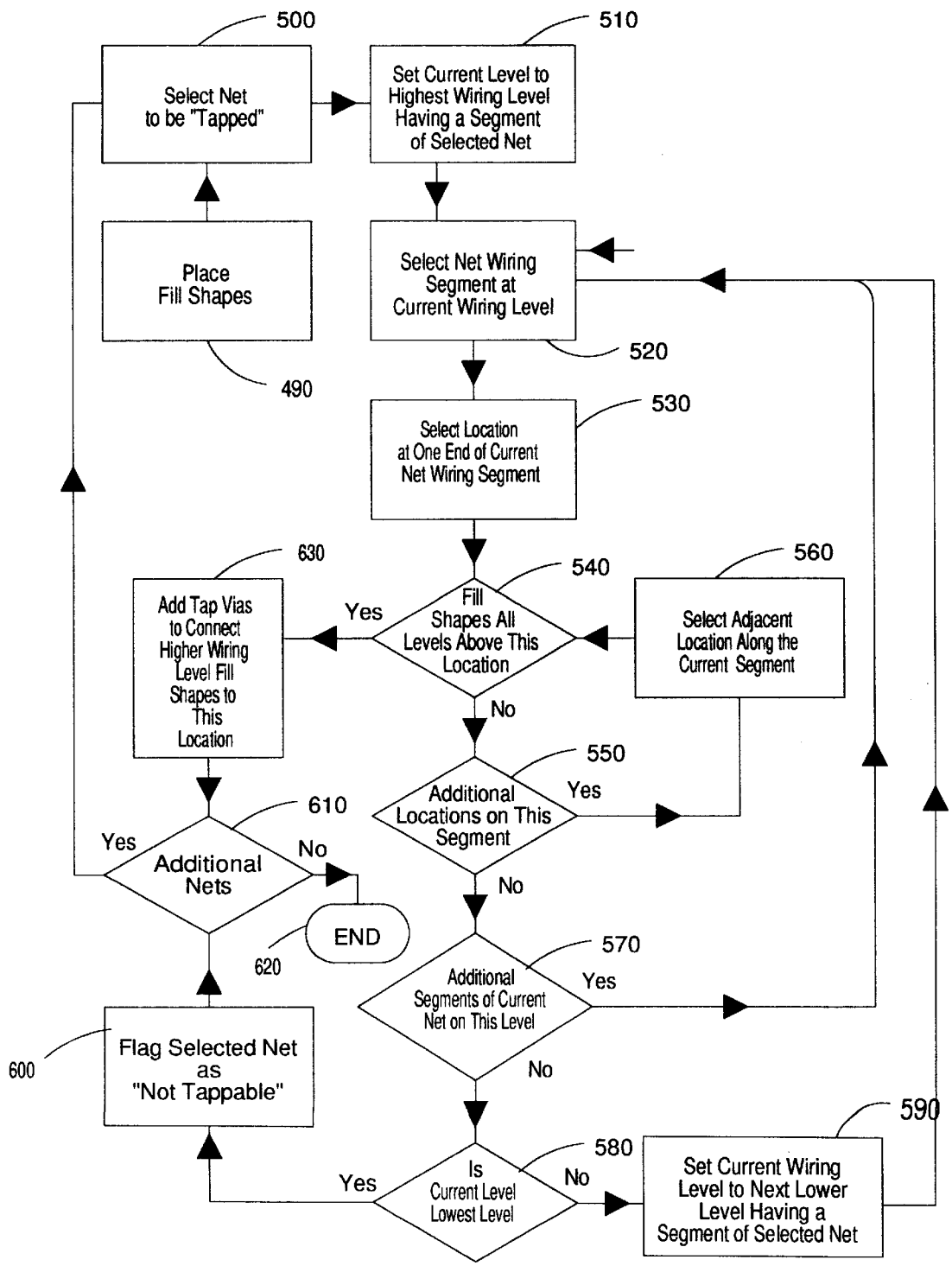
FIG. 6 is a flowchart illustrating a first method of inter-level connection of fill shapes according to the present invention.

A first method of forming vertical conductive stacks is illustrated in FIG. 6 and described below. FIG. 6 is a flowchart illustrating a first method of inter-level connection of fill shapes according to the present invention. First in step 490 fill shapes are placed in each wiring level, either by presently practiced methods or using one of the two earlier presented methods. When one of the two earlier presented methods are used, the possibility for creation of a successful tap is greatly increased as many more fill shapes will be vertically aligned. Then, in step 500 the net to be tapped is selected. Next in step 510, the current wiring level is set to the highest wiring level having a wire segment of the selected net. Then in step 520, a wire segment of the current net is selected and in step 530 a location on one end of the wiring segment is selected. Next test 540 is performed to see if fill shapes exist in all levels above this location. If fill shapes do not exist then the test of step 550 is performed to see if there are additional locations on this segment, if there are, then the next adjacent location on the segment is selected in step 560 and the process loops to step 540. If there are no additional locations on this segment then the test of step 570 is performed. This test determines if additional segments of the current net exist on the current wiring level. If there are additional segments the process loops to step 520. If there are no additional segments on this level the test of step 580 is performed to determine if the current level is the lowest level on which a segment of the present net exists. If there are lower levels available the process loops to step 590 where the current wiring level is set to the next lower level having a wire segment of the current net and the process loops to step 520. If there are no lower levels containing a wire segment of the current net, the net is flagged and "not tappable" in step 600 and it is determined in step 610 if additional nets are to be tapped. If yes, the process loops to step 500. If not, the process terminates in step 620 and the dataset with fill shapes and "tapping vias" added is complete.

Returning to step 540. If there are fill shapes in all wiring levels above the current location then tapping vias are added in step 630 and the process loops to step 610.

Figure 7:
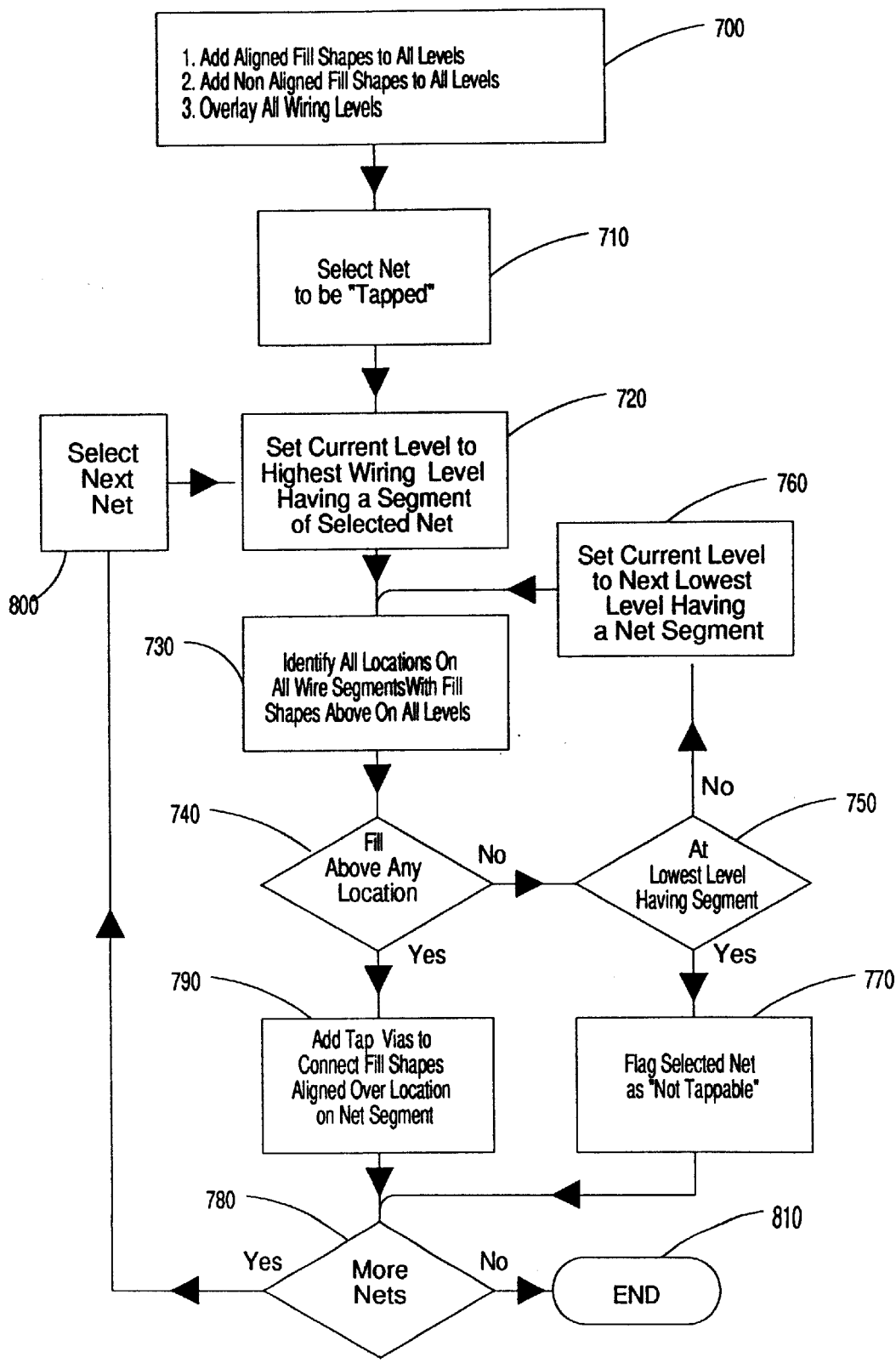
FIG. 7 is a flowchart illustrating a second method of inter-level connection of fill shapes according to the present invention.

A second method of forming vertical conductive stacks is illustrated in FIG. 7 and described below. FIG. 7 is a flowchart illustrating a second method of inter-level connection of fill shapes according to the present invention and is described below. In step 700 aligned fill shapes are added to all levels by using one of the two earlier presented methods or by other means that results in aligned fill shapes. Additional nonaligned fill shapes may be added afterwards, as well, and all wiring levels are overlaid. Next in step 710, a net to be tapped is selected. Then in step 720 the current level is set to the highest wiring level having a segment of the selected net. Next in step 730, all locations of all wire segments having fill patterns in all levels above any of the locations are identified. Next in step 740, a test is performed to see if any such locations exist. If not, then the test in step 750 is performed to see if the current level is the lowest level. If it is not, then the current level is set to the next lowest level having a net segment of the selected net and the process loops to step 730. If the current level is the lowest level having a segment then the net is flagged as "not tappable" in step 770 and the process loops to step 780.

Returning to step 740. If a location where at least one wire segment having fill patterns in all levels above exists then tapping vias are added in step 790 and the process loops to step 780. Usually tapping vias are added over one location. In step 780 a test is performed to determine if additional nets are to be tapped. If yes, then the next net is selected in step 800 and the process loops to step 720. If no further nets are to be tapped then the process terminates in step 810 and the dataset with fill shapes and "tapping vias" added is complete.

Figure 8:
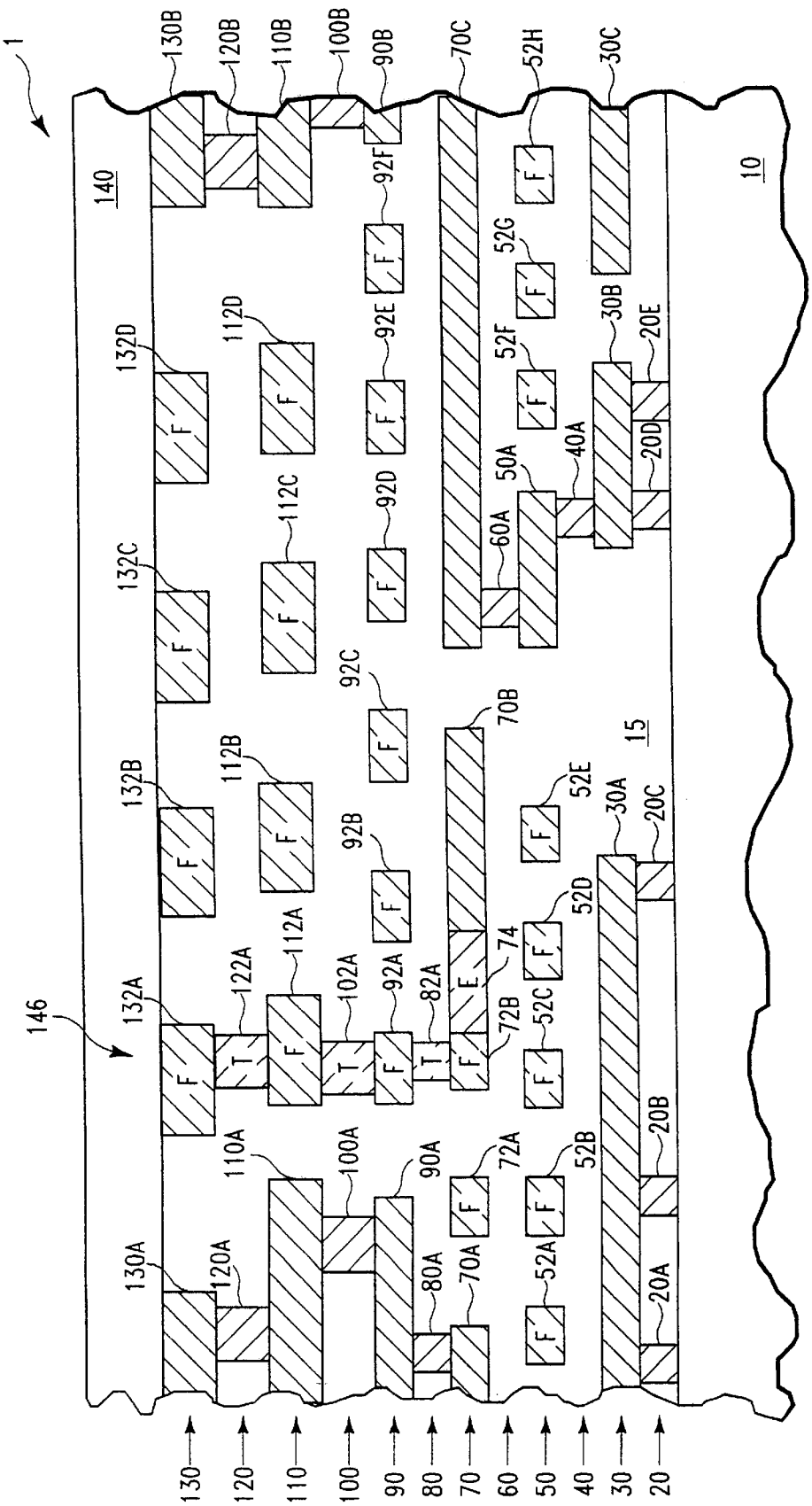
FIG. 8 is a cross-sectional partial view through the wiring and interconnect levels of a semiconductor die illustrating inter-level and intra-level connection of fill shapes according to the present invention.

Turning to FIG. 8. FIG. 8 is a cross-sectional partial view through the wiring and interconnect levels of a semiconductor die illustrating inter-level and intra-level connection of fill shapes according to the present invention. In FIG. 8 vertical conductive stack 146 is formed from fill shapes 72B, 92A, 112A, and 132A connected by tapping vias 82A, 102A, and 122A. Connection between conductive stack 146 and conductive wire 70B has been made by conductive link wire 74 which has been marked with an "E." Fill shape 72B, link wire 74, and conductive wire 70B may be thought of as a wire segment. The method of placement of the tapping vias and the link wire is illustrated in FIG. 9 and described below.

Figure 9:
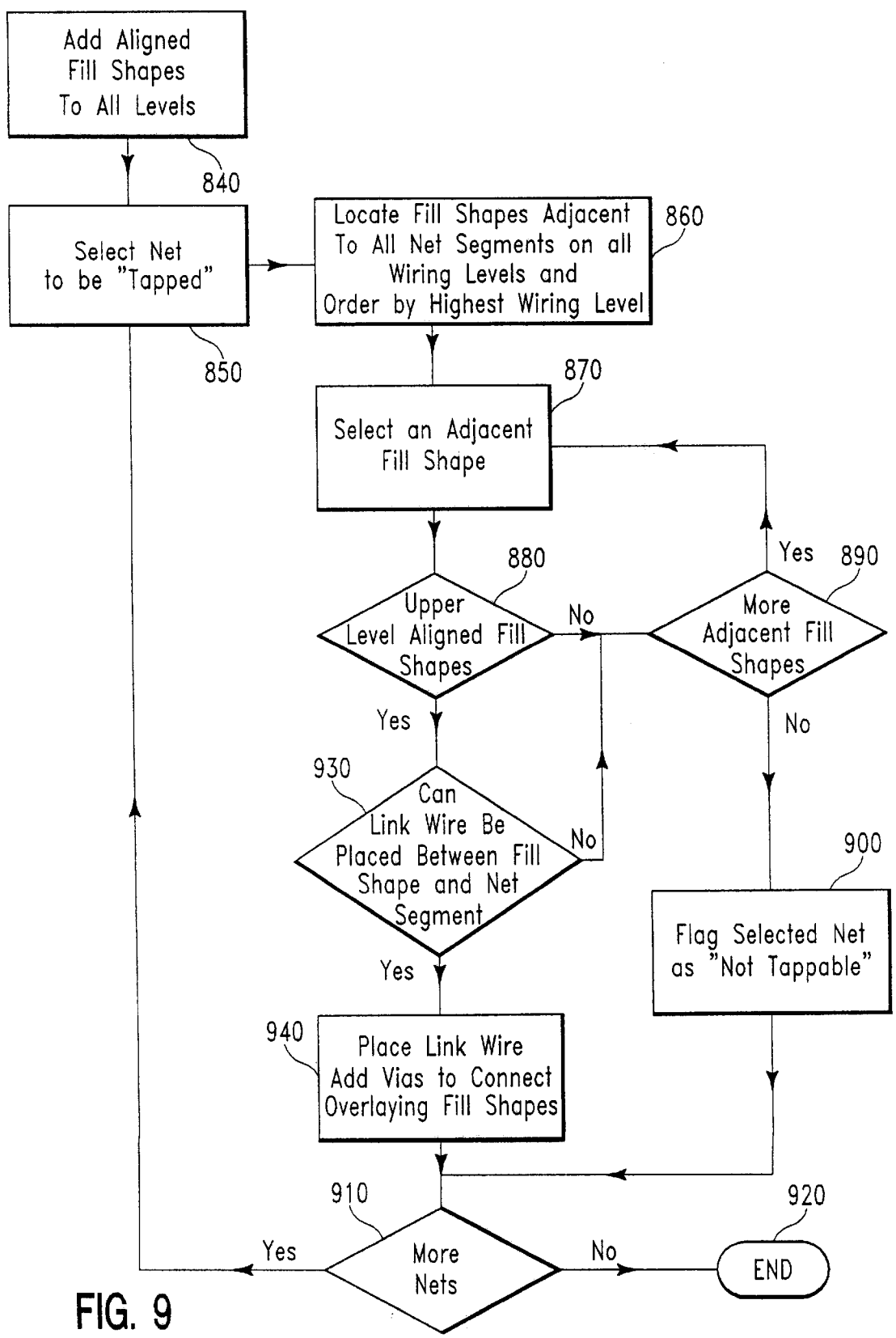
FIG. 9 is a flowchart illustrating a method of inter-level and intra-level connection of fill shapes according to the present invention.

FIG. 9 is a flowchart illustrating a method of inter-level and intra-level connection of fill shapes according to the present invention. First, in step 840, aligned fill shapes added to all levels by using one of the two earlier presented methods or by another method forming aligned fill shapes. Then, in step 850, a net to be tapped is selected. Next, in step 860, all fill shapes adjacent to all net segments on all wiring levels are found, and ordered by highest wiring level. Then in step 870, an adjacent fill shape is selected according to ordering hierarchy. Next in step 880 a test is performed to determine if there is a consecutive sequence of upper level aligned fill shapes. If there are not, the test in step 890 is performed to see if more adjacent fill shapes exist, if more exist then the process loops to step 870, if not then step 900 is performed, which flags the net as "not tappable", and the presence of additional nets determined in step 910. If there are more nets to be tapped the process loops to step 850, if there are no more nets to be tapped the process is terminated in step 920 and the dataset with link wire and "tapping vias" added is complete.

Returning to step 880. If there are upper level aligned fill shapes the test in step 930 is performed which determines if a link wire can be placed between the fill shape and the net segment. If a link can not be placed then the process loops to step 890, if a link can be placed then in step 940, the link wire is placed and the tapping vias placed and the process loops to step 910.

Figure 10:
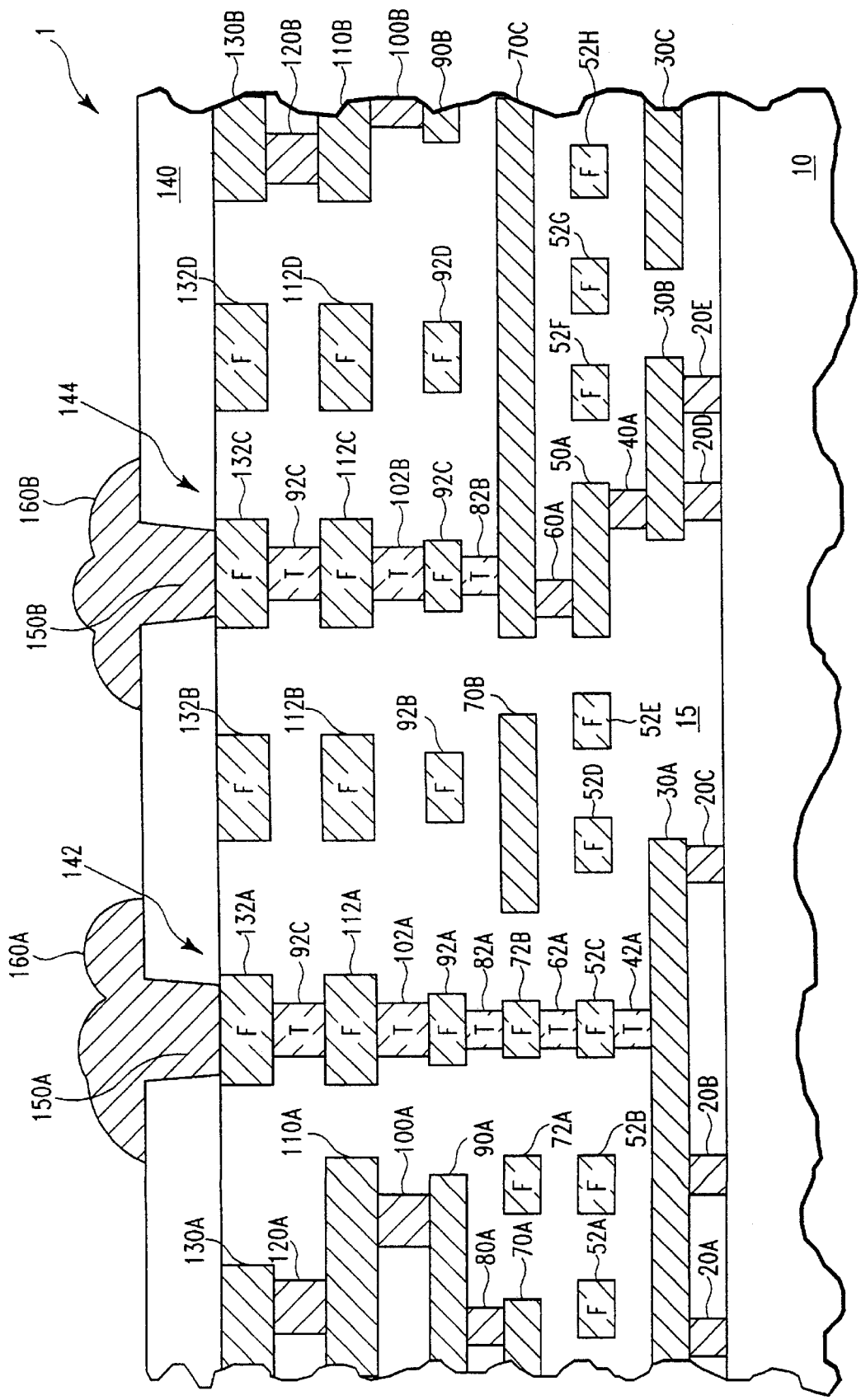
FIG. 10 is a cross-sectional partial view through the wiring and interconnect levels of a semiconductor die illustrating post device fabrication formed contacts to stacks of inter-level connected fill shapes according to the present invention.
Figure 11:
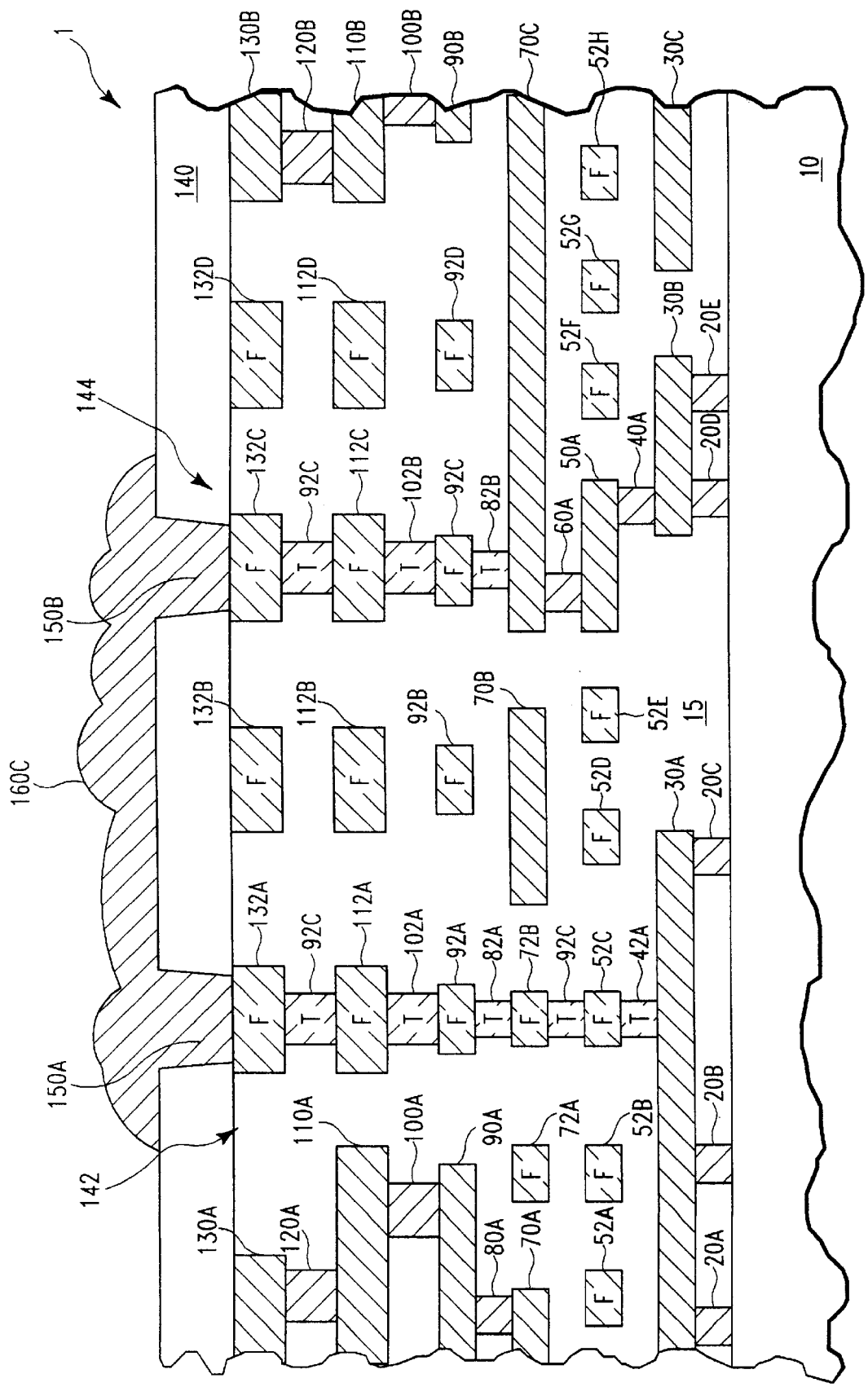
FIG. 11 is a cross-sectional partial view through the wiring and interconnect levels of a semiconductor die illustrating a post device fabrication formed interconnects of post device fabrication formed contacts to stacks of inter-level connected fill shapes according to the present invention.
Figure 12:
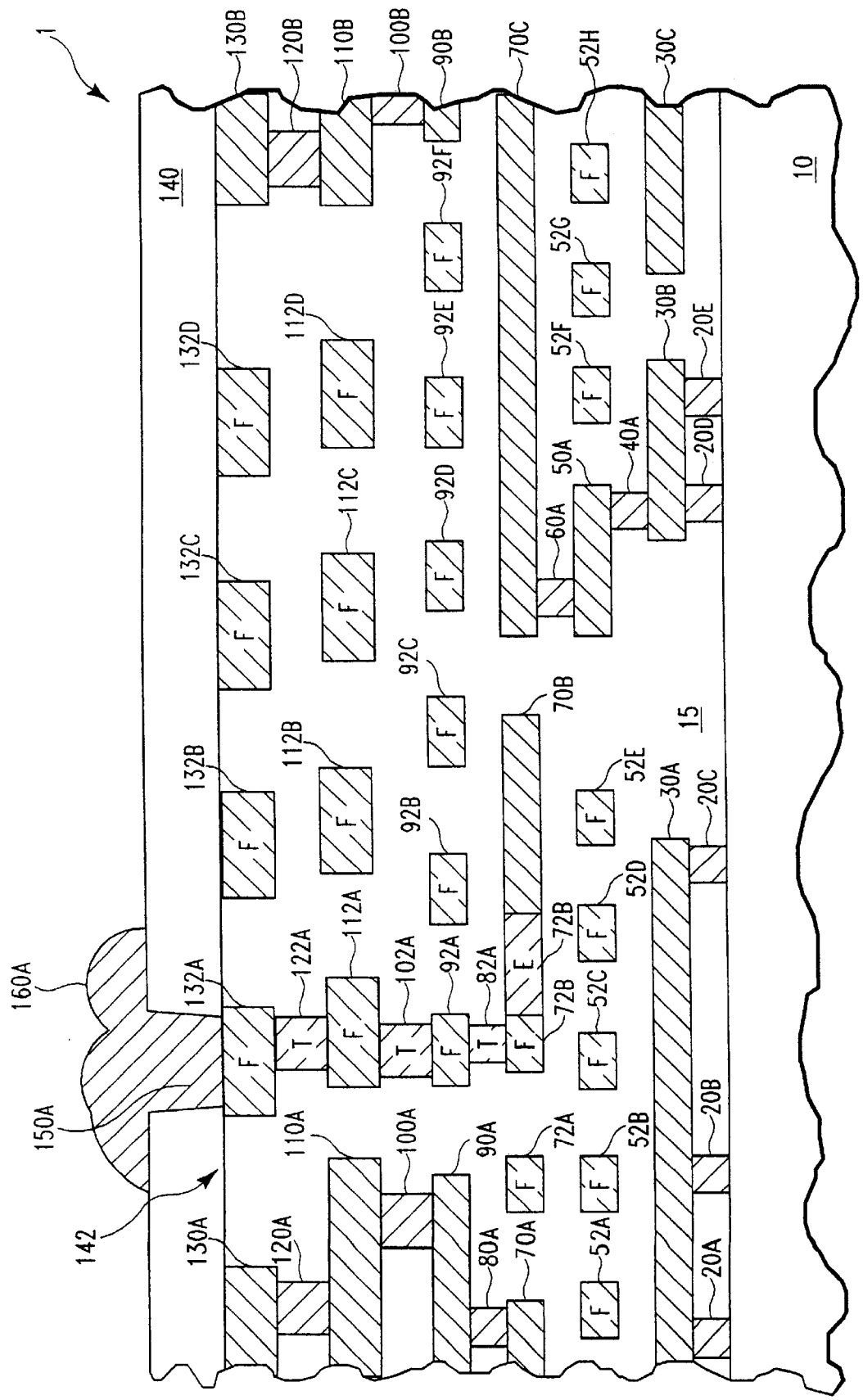
FIG. 12 is a cross-sectional partial view through the wiring and interconnect levels of a semiconductor die illustrating a post device fabrication formed contact to a stack of inter-level connected fill shapes to according to the present invention illustrated in FIG. 8.

Turning to FIGS. 10 through 12. These figures are intended to illustrate methods of making electrical connection to the vertical conductive stacks previously described when the uppermost fill shape is not large enough to be contacted with a convention test probe directly.

FIG. 10 is a cross-sectional partial view through the wiring and interconnect levels of a semiconductor die illustrating post device fabrication formed contacts to stacks of inter-level connected fill shapes according to the present invention. In FIG. 10, opening 150A has been made in passivation 140 exposing fill shape 132A which forms the topmost portion of vertical conductive stack 142 which is contacting conductive wire 30A and probe pad 160A has been formed. Similarly opening 150B has been made in passivation 140 exposing fill shape 132C which forms the topmost portion of vertical conductive stack 144 which is contacting conductive wire 70C, and probe pad 160B has been formed. Openings 150A and 150B and pads 160A or 160B may be formed using Focused Ion Beam (FIB) techniques, or evaporation or deposition and dry or wet etching techniques.

FIG. 11 is a cross-sectional partial view through the wiring and interconnect levels of a semiconductor die illustrating a post device fabrication formed interconnects of post device fabrication formed contacts to stacks of inter-level connected fill shapes according to the present invention. In FIG. 11, opening 150A has been made in passivation 140 exposing fill shape 132A which forms the topmost portion of vertical conductive stack 142 which is contacting conductive wire 30A. Similarly opening 150B has been made in passivation 140 exposing fill shape 132C which forms the topmost portion of vertical conductive stack 144 which is contacting conductive wire 70C, and interconnection 160C has been formed. Openings 150A and 150B and connection 160C may be formed using FIB techniques, or evaporation or deposition and dry or wet etching techniques.

FIG. 12 is a cross-sectional partial view through the wiring and interconnect levels of a semiconductor die illustrating a post device fabrication formed contact to a stack of inter-level connected fill shapes to according to the present invention illustrated in FIG. 8. In FIG. 12, opening 150A has been made in passivation 140 exposing fill shape 132A which forms the topmost portion of vertical conductive stack 142 which terminates in fill shape 72B, and probe pad 160A has been formed. Link wire 74 connects fill shape 72B to conductive wire 70B. Opening 150A and connection 160A may be formed using FIB techniques, or evaporation or deposition and dry or wet etching techniques.

The description of the embodiments of the present invention is given above for the understanding of the present invention. It will be understood that the invention is not to the particular embodiments described herein, but is capable of various modifications, rearrangements, combinations and substitutions will now become apparent to those skilled in the art without departing from the scope of the invention. For example, it should not be taken that aligned fill shapes must be symmetrically aligned, though they may be. It is sufficient that alignment be enough that a sight of view is created or that a via may be placed between the upper and lower fill shapes to be connected. Nor is it necessary that fill shapes be aligned in all levels. Alignment in some often will suffice to carry out the purposes of the present invention.

Therefore it is intended that the following claims cover all such modifications and changes as fall within the true spirit and scope of the invention.

What is claimed is:

1. A method for placing fill shapes in semiconductor device having a multiplicity of wiring levels, said wiring levels having conductive wires and said fill shapes, comprising the steps of:

(a) defining a virtual grid having a pitch;
   (b) selecting a wiring level to fill;
   (c) placing fill shapes for said wiring level by aligning each fill shape to said virtual grid; and
   (d) repeating steps (b) and (c) until all wiring levels requiring fill shapes have been filled.

2. The method according to claim 1 wherein said pitch of said virtual grid is variable and a function of the design pitch of the wiring level being filled.

3. The method according to claim 2 wherein said selection of wiring levels to fill is from lowest to uppermost.

4. A method for placing fill shapes in semiconductor device having a multiplicity of wiring levels, said wiring levels having conductive wires and said fill shapes, comprising the steps of:
   (a) placing fill shapes in an uppermost wiring level;
   (b) selecting an immediately lower wiring level to fill;
   (c) placing fill shapes for said immediately lower wiring level by aligning each fill shape in said immediately lower wiring level to a corresponding fill shape in an immediately upper wiring level;
   (d) repeating steps (b) and (c) until all wiring levels requiring fill shapes have been filled.

5. The method according to claim 4 further comprising the step of placing additional non-aligned fill shapes in at least some of said wiring levels.

6. A method for forming an electrical tap to a selected conductive wire in semiconductor device having a multiplicity of wiring levels having conductive wires and a multiplicity of interconnect levels between said wiring levels, said interconnect levels having vias for interconnecting said conductive wires, comprising the steps of:
   placing a fill shape in a wiring level immediately above the wiring level having said selected conductive wire to be tapped, said fill shape aligned to at least a portion of said selected conductive wire; and
   placing a via between said fill shape and said selected conductive wire to be tapped.

7. A method for forming an electrical tap to a selected conductive wire in semiconductor device having a multiplicity of wiring levels having conductive wires and a multiplicity of interconnect levels between said wiring levels, said interconnect levels having vias for interconnecting said conductive wires, comprising the steps of:
   placing a set of aligned fill shapes in a set of wiring levels immediately above the wiring level having said selected conductive wire to be tapped, each wiring level of said set of wiring levels having at least one fill shape of said set of aligned fill shapes, said fill shapes aligned to each other and to at least a portion of said selected conductive wire to be tapped; and
   placing a set of vias to connect each of said aligned fill shapes and said selected conductive wire to be tapped.

8. The method according to claim 7, wherein said set of wiring levels includes the uppermost wiring level of said semiconductor device.

9. A method for forming an electrical tap to a selected conductive wire in semiconductor device having a multiplicity of wiring levels having conductive wires and a multiplicity of interconnect levels between said wiring levels, said interconnect levels having vias for interconnecting said conductive wires, comprising the steps of:
   placing an adjacent fill shape in the same wiring level and adjacent to said selected conductive wire to be tapped;
   placing an upper fill shape in a wiring level immediately above the wiring level having said selected conductive wire to be tapped and aligned to said adjacent fill shape;
   placing an extension wire connecting said adjacent fill shape and said selected wire to be tapped; and
   placing a via to connect said upper fill shape and said adjacent fill shape.

10. A method for forming an electrical tap to a selected conductive wire in semiconductor device having a multiplicity of wiring levels having conductive wires and a multiplicity of interconnect levels between said wiring levels, said interconnect levels having vias for interconnecting said conductive wires, comprising the steps of:
    placing an adjacent fill shape in the same wiring level and adjacent to said selected conductive wire to be tapped;
    placing a set of aligned fill shapes in a set of wiring levels immediately above the wiring level having said selected conductive wire to be tapped, each wiring level of said set of wiring levels having at least one fill shape of said set of aligned fill shapes, and aligned to each other and to said adjacent fill shape; and
    placing a via between each of said aligned fill shapes and said selected conductive wire to be tapped;
    placing an extension wire connecting said adjacent fill shape and said selected wire to be tapped; and
    placing a set of vias to connect each of said aligned fill shapes and said adjacent fill shape.

11. The method according to claim 10, wherein said set of wiring levels includes the uppermost wiring level of said semiconductor device.

12. A method for forming an electrical tap to a network circuit formed of wire segments, in a semiconductor device having a multiplicity of wiring levels containing said wire segments and a multiplicity of interconnect levels between said wiring levels, said interconnect levels having vias for interconnecting said wire segments, comprising the steps of:
    (a) placing a set of fill shapes in at least a set of said wiring levels;
    (b) setting a current wiring level to the highest wiring level having a segment of said network circuit;
    (c) setting a current wire segment to a segment of said network circuit;
    (d) setting a current location on the current wire segment;
    (e) if aligned fill shapes exist in every wire level of said set of wire levels above the current location, placing a set of vias to connect each of said aligned fill shapes to each other and to said location on said wire segment;
    (f) if aligned fill shapes do not exist above said location, setting another location on the current segment as the current location and repeating steps (e) through (f);
    (g) if no additional locations exist on the current segment setting the current segment to another segment on the current wiring level and repeating steps (d) through (g); and
    (h) if no additional wire segment of said circuit network exist in the current wiring level setting the current wiring level to the next lower wiring level containing a wire segment of said network circuit and repeating steps (c) through (h) until the lowest wiring level containing a wire segment of the network circuit has been processed.

13. The method according to claim 12 wherein said set of fill shapes contains a subset of aligned fill shapes.

14. A method for forming an electrical tap to a network circuit formed of wire segments, in a semiconductor device having a multiplicity of wiring levels containing said wire segments and a multiplicity of interconnect levels between said wiring levels, said interconnect levels having vias for interconnecting said wire segments, comprising the steps of:
    (a) placing set of fill shapes, a subset of said fill shapes being aligned fill shapes, in at least a set of said wiring levels;
    (b) setting a current wiring level to the highest wiring level having a segment of said network circuit;
    (c) identifying all locations on all wire segments in the current wiring level having aligned fill shapes in every wire level of said set of wire levels above the current location;

(e) if aligned fill shapes exist in every wire level of said set of wire levels above the current location, placing a set of vias to connect each of said aligned fill shapes to each other and to at least one of said locations; and (f) if aligned fill shapes do not exist above any location, setting the next lowest wiring level as the current wiring level and repeating steps (c) through (f) until the lowest wiring level containing a wire segment of the network circuit has been processed.

15. A method for forming an electrical tap to a network circuit formed of wire segments, in a semiconductor device having a multiplicity of wiring levels containing said wire segments and a multiplicity of interconnect levels between said wiring levels, said interconnect levels having vias for interconnecting said wire segments, comprising the steps of:

(a) placing fill shapes in at least a set of said wiring levels;

(b) creating a set of adjacent fill shapes by locating all fill shapes in all wiring levels adjacent to a wire segment of said network circuit;

(c) selecting one of said set of adjacent fill shapes and designating it the current adjacent fill shape;

(d) if aligned fill shapes exist in every wire level of said set of wire levels above the current adjacent fill shape, placing a set of vias to connect each of said aligned fill shapes to each other and to said current adjacent fill shape and a linking wire to connect said wire segment to said current adjacent fill shape;

(e) if aligned fill shapes do not exist above said current adjacent fill shape, setting another adjacent fill shape as the current adjacent fill shape and repeating steps (d) through (e) until entire said set of adjacent fill shapes has been processed.

16. The method according to claim 15 wherein said set of fill shapes contains a subset of aligned fill shapes.

\* \* \* \* \*